United States Patent [19]

Womack et al.

[11] Patent Number: 4,581,552

[45] Date of Patent: Apr. 8, 1986

[54] POWER-UP CLEAR CIRCUITRY HAVING TWO THRESHOLDS

[75] Inventors: Richard H. Womack; Brock Barton; Robert Martin, all of Dallas, Tex.

[73] Assignee: Texas Instruments Incorporated, Dallas, Tex.

[21] Appl. No.: 581,444

[22] Filed: Feb. 17, 1984

[51] Int. Cl.⁴ ............................................. H03K 17/22
[52] U.S. Cl. ................................ 307/594; 307/200 B; 307/246; 307/360; 307/605
[58] Field of Search ............... 307/200 A, 200 B, 360, 307/246, 247 R, 601, 591–595, 605, 290, 577, 579, 585

[56] References Cited

U.S. PATENT DOCUMENTS

| | | | |
|---|---|---|---|
| 4,045,688 | 8/1977 | Stewart | 307/585 |
| 4,103,187 | 7/1978 | Imamura | 307/585 |
| 4,196,362 | 4/1980 | Maehashi | 307/593 X |
| 4,385,245 | 5/1983 | Ulmer | 307/585 X |
| 4,409,501 | 10/1983 | Eickerman et al. | 307/585 X |
| 4,419,596 | 12/1983 | Kikuchi | 307/246 X |
| 4,446,381 | 5/1984 | Dalrymple | 307/200 B |

Primary Examiner—Stanley D. Miller
Assistant Examiner—D. R. Hudspeth
Attorney, Agent, or Firm—Richard A. Bachand; N. Rhys Merrett; Melvin Sharp

[57] ABSTRACT

Power-up clear circuitry includes a latch which powers-up in a preferred state. Threshold detect circuitry changes the state of the latch when the supply voltage reaches its operating value, and then switches itself off. Transient protection circuitry ensures that the latch properly powers-up in the preferred state after a supply transient which drops below the threshold voltage of the circuit devices.

4 Claims, 2 Drawing Figures

POWER-UP CLEAR CIRCUITRY HAVING TWO THRESHOLDS

BACKGROUND AND SUMMARY OF THE INVENTION

The present invention is generally related to power-up clear circuitry and more specifically related to CMOS power-up clear circuitry useful for integrated circuit designs.

Power-up clear circuitry as such is known in the art. The function of this circuitry is to generate a signal when the supply voltage reaches the operating level. This signal can be used to simply enable the remainder of the circuitry, or to reset the remaining circuitry to a known state. Such circuitry can be incorporated on an integrated circuit chip in order to ensure proper operation of that chip when power is applied.

Present power-up clear circuitry generally employs a latch and threshold detection circuitry. The state of the latch determines whether the chip is in the power-up state or the normal operating state. The threshold detection circuitry enables the latch when the supply voltage is at the operating level. Typically, an external reset signal is provided to reset the latch and end the power-up sequence. This signal can be generated manually, as for example by means of a switch, or by circuitry external to the power-up clear circuitry.

Power-up clear circuitry as presently known has several important drawbacks. One such drawback is that the threshold detect circuitry draws standby power. This draws power away from the remaining circuitry on an integrated circuit chip, and is especially important in low power, CMOS applications.

Another important drawback is that prior art power-up clear circuitry will not necessarily operate properly after a supply voltage transient. If the supply voltage drops below the threshold voltage of devices is on an integrated circuit chip, the logical state of those devices is not guaranteed when supply voltage again rises above the threshold voltage. Present power-up circuitry has the defect that the latch may power-up in the normal operating state if the supply voltage transient is sufficiently short. Thus, although the state of the remainder of the devices may be random, no power-up clear pulse is generated.

Present circuits require an external signal to activate the power-up sequence. Finally, present power-up clear circuitry that is suitable for integrating on a CMOS integrated circuit chip is unduly complex.

It is therefore an object of the present invention to supply CMOS power-up clear circuitry which is suitable for integration on a chip with other circuitry. It is a further object that such power-up clear circuitry ensures that no power-up clear pulse is generated when the supply voltage drops but remains above the device threshold voltage, and further ensures that a power-up clear pulse is always generated if the supply voltage drops below the threshold voltage. It is another object of the present invention that such power-up clear circuitry draw no standby power once the power-up clear pulse has been generated and the remainder of the chip is in normal operation. It is yet another object of the present invention that such power-up clear circuitry is self-executing, and requires no external signal to activate.

Therefore, in accordance with the present invention, power-up clear circuitry includes a threshold detect circuit and a latch. The latch is a preferential cross-coupled latch, and powers-up in a known state. The threshold detect circuitry detects when the supply has reached the operating voltage, and changes the state of the latch. Delay circuitry coupled to the output of the latch causes the power-up clear signal to change to a normal operation state a predetermined time delay after the latch changes state. The delay circuitry also provides signals to the threshold detection circuitry which causes same to switch itself off during normal operating conditions. Supply voltage transient protect circuitry is coupled to the latch, and ensures that the latch will always power-up in a preferred state. This is accomplished by using a charge pump technique and the supply transient protect circuitry to ensure that the latch is completely clear as soon as the supply voltage drops below the threshold voltage.

The novel features which characterize the present invention are defined by the appended claims. The foregoing and other objects and advantages of the present invention will hereafter appear, and for purposes of illustration, but not of limitation, a preferred embodiment is shown in the accompanying drawings.

DESCRIPTION OF THE PREFERRED EMBODIMENT

The preferred embodiment will be described in relation to a CMOS circuit operating at a supply voltage of 5 volts. The supply voltage is represented by $V_{cc}$. The threshold voltage of the field effect transistors will be represented bt $V_T$, which is determined by processing techniques as is well known in the art.

Figure 1:
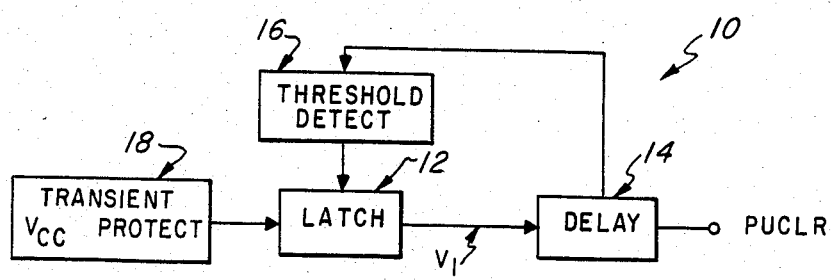
FIG. 1 is a block diagram of a preferred power-up clear circuit according to the present invention.

Referring to FIG. 1, a power-up clear circuit 10 generates a clear signal PUCLR when power is initially applied to an integrated circuit chip which contains such circuit 10. As will be described below, a clear signal will also be generated whenever the supply voltage $V_{cc}$ drops below the threshold voltage $V_T$. When power is initially applied to the circuit, $V_{cc}$ rises from 0 volts toward 5 volts. As $V_{cc}$ passes $V_T$, latch 12 activates in a known state. This known state is often referred to as the preferred state. Latch 12 is a preferential cross-coupled latch, and always powers-up in the preferred state due to device geometries as described below. When the latch 12 powers-up, output voltage signal $V_1$ is transmitted to delay circuitry 14. After a time delay, PUCLR is set to a known state which is function of $V_1$. In the preferred embodiment, $V_1$ is high and PUCLR is low. The remainder of the circuitry is held in a known, power-up state. The remainder of the circuitry on the chip will be released to normal operation when the signal PUCLR goes high.

It is desirable that the remaining circuitry not be rendered operational until $V_{cc}$ has reached approximately its nominal operating value. This is accomplished by the threshold detect circuit 16, which resets the latch 12 when $V_{cc}$ reaches, in the preferred embodiment, a level greater than 2 $V_T$. The latch 12 changes state, which causes PUCLR to change state after a suitable number of gate delays as determined by delay circuit 14.

As described below, the design of the latch 12 is such that the power-up circuitry 10 will not generate another clear pulse unless $V_{cc}$ drops below $V_T$. Thus, minor variations in $V_{cc}$, which would have no effect on proper operation of the remainder of the circuitry, would not cause a clear pulse to be generated. However, if $V_{cc}$ should drop below $V_T$, it is desired that a power-up clear pulse always be generated. If a transient situation should drive $V_{cc}$ below $V_T$ for only a short duration, it is possible that the latch 12 will power-up in the non-preferred state. This would be due to delay with which internally stored charges drain away through low leakage currents. Such a situation is prevented by the transient protect circuit 18. The transient protect 18 automatically drains off stored charge within the latch 12 whenever $V_{cc}$ drops below $V_T$. This ensures that the latch 12 will power-up in the preferred state after a short transient.

Figure 2:
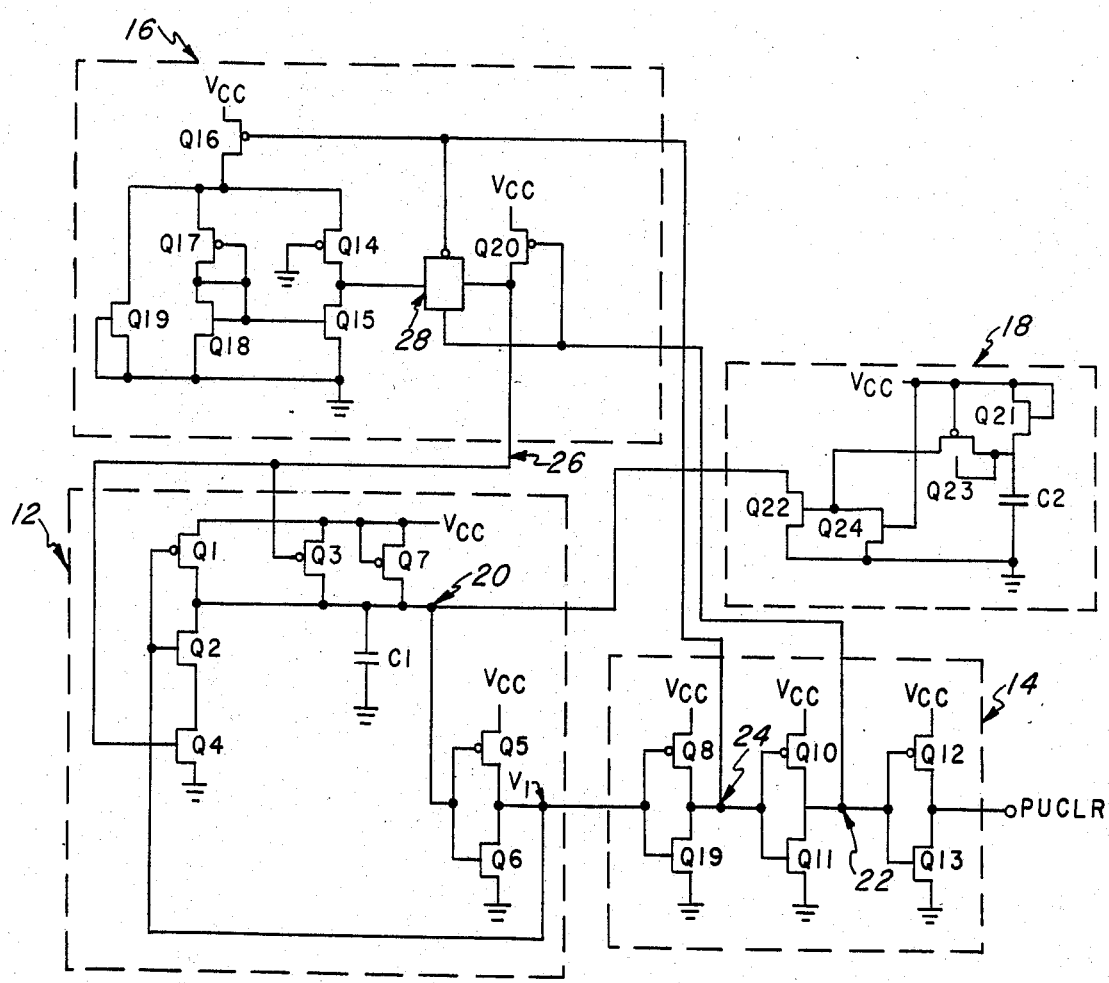
FIG. 2 is a schematic diagram of the block diagram of FIG. 1.

Referring to FIG. 2, a schematic diagram of the power-up clear circuit 10 is shown. The latch 12 comprises generally a latch made of a NAND gate and an inverter. The NAND gate is formed by transistors $Q_1$, $Q_2$, $Q_3$ and $Q_4$. Transistors $Q_5$ and $Q_6$ form the inverter. N-channel transistors $Q_2$ and $Q_4$ are fabricated to be larger than P-channel transistors $Q_1$ and $Q_3$. $Q_2$ and $Q_4$ therefore have larger gain, driving node 20 low at power-up. $Q_5$ is made larger than $Q_6$, so that $V_1$ is brought high upon power-up. $V_1$ is coupled to the gates of $Q_1$ and $Q_2$, and the voltage at node 20 is coupled to the gates of $Q_5$ and $Q_6$. As will be described below, the voltage coupled to the bases of transistors $Q_3$ and $Q_4$ is also low at power-up. These conditions set the latch 12 so that $V_1$ is initially brought high during the power-up sequence. Capacitor $C_1$ is included to ensure that node 20 remains low even if $V_{cc}$ rises very quickly. $C_1$ grounds any extremely high frequency signals caused by a fast $V_{cc}$ power-up, ensuring that node 20 remains low long enough for the latch 12 to set the preferred state.

Transistor $Q_7$ turns on if $V_{cc}$ drops below the voltage at node 20. Capacitor $C_1$ will then discharge so as to stay equal to $V_{cc}$. $Q_7$ operates to help prevent possible latch-up, and has no effect on the function of the latch.

The delay circuitry 14 comprises 3 inverters, consisting of transistors $Q_8/Q_9$, $Q_{10}/Q_{11}$, and $Q_{12}/Q_{13}$. During the power-up sequence, the inverters in the delay circuitry 14 will power-up when $V_{cc}$ is higher than $V_T$. Since $V_1$ is held high by the latch 12, it is seen that PUCLR will be driven low. It will also be apparent that the voltage at node 22 is the same as $V_1$, that is, high, and the voltage at node 24 is low. The value of PULCR will generally not be guaranteed until 3 gate delays after $V_1$ is latched high.

The threshold detect circuit 16 acts as a $V_T$ multiplier. The general function of this circuit is to generate a low output signal when $V_{cc}$ rises to some point above $2 V_T$. The output signal is generated on line 26 which is connected to the base of transistors $Q_3$ and $Q_4$. The output signal for line 26 is taken from transistors $Q_{14}$ and $Q_{15}$, and passes through transmission gate 28. The signal controlling transmission gate 28 are coupled to nodes 22 and 24, and cause the transmission gate to be conducting when $V_{cc}$ has risen above $V_T$. Transistor $Q_{16}$ controls current into the threshold detect circuit 16, and is also turned on when $V_{cc}$ rises above $V_T$. The threshold detect circuit 16 operates only when $Q_{16}$ is on.

$Q_{14}$ will always conduct when $V_{cc}$ is greater than $V_T$, so that the voltage on line 26 is high during the initial power-up stages. Transistors $Q_{17}$ and $Q_{18}$ act with $Q_{15}$ to form a $V_T$ multiplier. $Q_{15}$ and $Q_{18}$ form a current mirror. When $V_{cc}$ is equal to $V_T$, $Q_{14}$ is conducting and $Q_{17}$ is off. $Q_{17}$ is fabricated larger then $Q_{14}$, so that as $V_{cc}$ rises above $2 V_T$, $Q_{17}$ turns on faster than $Q_{14}$. At a trip point determined by the geometry ratio of $Q_{17}$ and $Q_{14}$, more current flows through $Q_{17}$ and $Q_{18}$ than through $Q_{14}$ and $Q_{15}$. This trip point is preferably slightly above $2 V_T$, and should be equal to or less than the nominal operating value of $V_{cc}$. The current mirror of $Q_{18}$ and $Q_{15}$ tries to draw as much current through $Q_{14}$ as is passing through $Q_{17}$. Since this is not possible, the signal on line 26 goes low.

The purpose f $Q_{19}$ is to act as a clamp to prevent the node between $Q_1$ and $Q_{14}$ from going below grounding. $Q_{16}$ has no effect on the function of the latch 16.

When $V_{cc}$ rises above the trip level of threshold detect 16, and $Q_{15}$ tries to conduct more current than $Q_{14}$ can source, which drives the signal on line 26 low, $Q_3$ turns on and $Q_4$ turns off, causing the voltage at node 20 to go high. $C_1$ is charged to $V_{cc}$ through $Q_3$. This causes the voltage $V_1$ to go low, setting the latch 12 into the non-preferred state. The latch remains in the non-preferred state during normal operation of the remainder of the circuitry.

When $V_1$ goes low, the voltage at node 24 goes high one gate delay later. Node 22 goes low one gate delay after that. The signal PUCLR goes high two gate delays after node 24 goes high. This signals the end of the power-up sequence, and allows the remaining circuitry on the chip to undergo normal operation.

When nodes 22 and 24 change value, transmission gate 28 will be driven to the non-conducting state and $Q_{16}$ will be turned off. At the same time, $Q_{20}$ will be turned on by the low signal from node 22. This ensures that the signal on line 26 will be connected to $V_{cc}$ and remain high. Without transistor $Q_{20}$, line 26 will be floating and the input to latch 12 will be unknown.

When $Q_{16}$ is turned off, no current flows through the threshold detect circuit. Thus, whenever the power-up clear sequence has been completed, the threshold detect circuit shuts down and draws no standby power. Without transistor $Q_{16}$ to isolate $Q_{17}$ from $V_{cc}$, current would continue to flow through $Q_{17}$ and $Q_{18}$.

The latch 12 will remain in the non-preferred, or normal circuit operation, state unless $V_{cc}$ drops below $V_T$. In that case, the circuit shuts off and capacitor $C_1$ will slowly discharge by way of leakage currents through $Q_2$ and $Q_4$. If $V_{cc}$ drops below $V_T$ for only a short period of time, the latch 12 may remain in the non-preferred state when the circuitry powers-up again. This is undesirable in the preferred embodiment, as it is desired to reset all the circuitry on the chip whenever $V_{cc}$ drops below $V_T$. This ensures known operating states at all times.

To ensure that the latch 12 powers-up in a preferred state after a transient drop in $V_{cc}$, the transient protect circuit 18 discharges $C_1$ to ground as soon as $V_{cc}$ drops below $V_T$. This is accomplished through a charge pump technique used on capacitor $C_2$. In the normal operating mode, with PUCLR high, the voltage at node 20 is high and $C_1$ is charged to $V_{cc}$. Transistor $Q_{21}$ charges $C_2$ to $V_{cc}$, and then turns off. The gate of $Q_{23}$ is coupled to $V_{cc}$, which is at least as high as the voltage on $C_2$, so that $Q_{23}$ is off. $Q_{24}$ is on whenever $V_{cc}$ is greater than $V_T$, holding $Q_{22}$ off. No current flows through $Q_{24}$ because $Q_{23}$ is off.

When $V_{cc}$ falls below its maximum value, the voltage on $C_2$ will remain constant. When $V_{cc}$ drops below its maximum value by the amount $V_T$, $Q_{23}$ will turn on and begin to discharge $C_2$ through $Q_{24}$. The voltage on $C_2$ will remain greater than $V_{cc}$ by the value $V_T$. When $V_{cc}$ drops below $V_T$, $Q_{24}$ will turn off. At that point, the voltage at the gate of $Q_{22}$ will be approximately 2 $V_T$, which is the voltage on the capacitors. $Q_{22}$ will thus turn on, and discharge capacitor $C_1$. $C_1$ will discharge quickly through $Q_{22}$, inasmuch as this is a direct, open path to ground. $C_2$ will eventually discharge by way of leakage currents through $Q_{24}$.

Even if $V_{cc}$ should stay below $V_T$ for only a short period of time, $C_1$ will be discharged through $Q_{22}$ and the latch 12 will be assured of powering-up in the preferred state as described above. If $V_{cc}$ does not drop below $V_T$, $Q_{22}$ will remain off and $C_1$ will remain charged. This ensures that the voltage at node 20 always remains high unless $V_{cc}$ drops too low.

Circuitry has been described which can be used to control the power-up sequence in an integrated circuit chip. Once the power-up sequence is completed, the power-up clear circuitry switches itself off and draws no standby power. If the supply voltage drops, but not below $V_T$, the power-up clear circuitry will not clear the circuit when $V_{cc}$ rises. However, if $V_{cc}$ drops below $V_T$, the circuitry will always go through the power-up clear sequence when $V_{cc}$ rises again. Thus, the latch circuitry 12 is always kept in the desired state regardless of fluctuations in the supply voltage $V_{cc}$.

The present invention has been illustrated by the circuitry described above, and it will become apparent to those skilled in the art that various modifications and alterations may be made thereto. Such variations fall within the spirit of the present invention, the scope of which is defined by the appended claims.

What is claimed is:

1. Power-up clear circuitry for use with a power supply voltage source comprising:
   a latch connected to said supply voltage source when said supply voltage source provides power to said circuitry, said latch being operative to power-up in a known state;
   means coupled to said latch for detecting when the voltage of said supply voltage source has reached a first preselected value, wherein the state of said latch is changed to said known state when the supply voltage reaches the first preselected value;
   transient protect means coupled to said latch and connected to said supply voltage source when said supply voltage source provides power to said circuitry, said transient protect means being operative for clearing said latch to a state other than said known state when the supply voltage falls below a second preselected value;
   said transient protect means including:
   a switching device coupled between ground and a charge storage element within said latch; and
   charge storage means coupled to said switching device for turning said switching device on when the supply voltage falls below the second preselected value, wherein the charge storage element is discharged when the supply voltage falls below the second preselected value.

2. The device of claim 1, wherein said detecting means further comprises means for disconnecting said detecting means from the power supply, wherein said detecting means draws no standby power.

3. The device of claim 1, wherein said latch, said detecting means and said transient protect means comprise complementary field effect devices.

4. A power-up clear cirduit for an integrated circuit using complementary field effect devices, comprising:
   a cross-coupled latch which powers up in a known state;
   first charge storage means coupled to said latch for delaying an internal state change of said latch to said known state;
   delay means coupled to an output of said latch, for generating a first signal at an output of said delay means at a fixed time delay after a change to state of said latch to said known state;
   voltage detect means coupled to an input of said latch for generating a second signal when a power supply voltage rises above a first preselected level, wherein said latch changes state to said known state when the second signal is generated;
   transmission means coupled to said delay means and to said detect means for disconnecting said detect means from said latch after said latch changes state to a state other than said known state;
   a first switch coupled to said delay means and to said detect means for disconnecting said detect means from the power supply when said latch changes state to a state other than said known state;
   a second switch coupled between said first charge storage means and power supply ground wherein said switch is normally nonconducting;
   second charge storage means for storing a voltage having a value of at least the first preselected voltage; and
   means coupled between said second charge storage means and said second switch for causing the voltage on said second storage means to remain at least a second preselected value above the supply voltage when the supply voltage drops below the first preselected value by an amount greater than the second preselected value, and for causing said second switch to conduct when the supply voltage drops below the selected value.

* * * * *

UNITED STATES PATENT AND TRADEMARK OFFICE
CERTIFICATE OF CORRECTION

PATENT NO. : 4,581,552

DATED : April 8, 1986

INVENTOR(S) : Richard H. Womack, Brock Barton and Robert Martin

It is certified that error appears in the above-identified patent and that said Letters Patent is hereby corrected as shown below:

In claim 4, line 1, delete "cirduit" and insert --circuit--;
        line 10, delete "to" and insert --of--.

Signed and Sealed this

Twenty-fourth Day of May, 1988

Attest:

DONALD J. QUIGG

Attesting Officer      Commissioner of Patents and Trademarks